US010483944B2

(12) United States Patent
Nakazawa et al.

(10) Patent No.: US 10,483,944 B2
(45) Date of Patent: Nov. 19, 2019

(54) MULTIPLEXER

(71) Applicant: TAIYO YUDEN CO., LTD., Tokyo (JP)

(72) Inventors: Hidetaro Nakazawa, Tokyo (JP); Masafumi Iwaki, Tokyo (JP); Takashi Matsuda, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 85 days.

(21) Appl. No.: 15/634,893

(22) Filed: Jun. 27, 2017

(65) Prior Publication Data

US 2018/0034443 A1 Feb. 1, 2018

(30) Foreign Application Priority Data

Jul. 29, 2016 (JP) .................................. 2016-150384

(51) Int. Cl.
*H03H 9/72* (2006.01)
*H03H 9/145* (2006.01)
*H03H 9/64* (2006.01)

(52) U.S. Cl.
CPC .......... *H03H 9/725* (2013.01); *H03H 9/1457* (2013.01); *H03H 9/14541* (2013.01); *H03H 9/14544* (2013.01); *H03H 9/64* (2013.01)

(58) Field of Classification Search
CPC ............... H03H 9/725; H03H 9/14541; H03H 9/14544; H03H 9/1457; H03H 9/64
USPC ......................................................... 333/133
See application file for complete search history.

(56) References Cited

U.S. PATENT DOCUMENTS

| 2011/0068655 A1* | 3/2011 | Solal | H03H 9/02858 |
| | | | 310/313 B |
| 2015/0288346 A1* | 10/2015 | Nakamura | H03H 9/205 |
| | | | 333/133 |
| 2016/0211829 A1* | 7/2016 | Iwaki | H03H 9/02559 |

FOREIGN PATENT DOCUMENTS

WO 2015/007319 A1 1/2015

OTHER PUBLICATIONS

Schweber, Bill,"SAW Filters Rescue Wireless Products from Impractical Discrete Implementations", Electronic Products, Apr. 30, 2015 (Year: 2015).*

* cited by examiner

*Primary Examiner* — Benny T Lee
*Assistant Examiner* — Hafizur Rahman
(74) *Attorney, Agent, or Firm* — CHEN YOSHIMURA LLP

(57) ABSTRACT

A multiplexer includes: a first filter including a series resonator connected in series and a parallel resonator connected in parallel between a common terminal and a first terminal, each of the series resonator and the parallel resonator including an IDT located on a piezoelectric substrate, first and second regions being alternately located in an extension direction of electrode fingers, which excite an acoustic wave, within an overlap region of the IDT in which the electrode fingers overlap, a width of at least one of the electrode fingers in the second region being greater than that in the first region, one or some resonators of the parallel resonator and the series resonator having a larger number of the second regions than a remaining resonator; and a second filter connected between the common terminal and a second terminal and having a passband higher than a passband of the first filter.

18 Claims, 14 Drawing Sheets

MULTIPLEXER

CROSS-REFERENCE TO RELATED APPLICATION

This application is based upon and claims the benefit of priority of the prior Japanese Patent Application No. 2016-150384, filed on Jul. 29, 2016, the entire contents of which are incorporated herein by reference.

FIELD

A certain aspect of the present invention relates to a multiplexer.

BACKGROUND

In recent years, as mobile phones support multiple bands and multiple modes, multiplexers including a plurality of filters have been used. A surface acoustic wave (SAW) resonator is used for the filter of the multiplexer. The filter using a SAW resonator is used as a bandpass filter in various circuits that process radio signals in a frequency band from 45 MHz to 2 GHz typified by, for example, mobile phones. In the SAW resonator, an Interdigital Transducer (IDT) including a plurality of electrode fingers is formed on a piezoelectric substrate such as a lithium tantalate ($LiTaO_3$) substrate or a lithium niobate ($LiNbO_3$) substrate. The region where the electrode fingers of the IDT overlap is an overlap region. The IDT excites a Shear Horizontal (SH) wave (leaky wave), a Rayleigh wave, or a boundary acoustic wave, which is a type of surface acoustic wave. Reflectors located at both sides in the main propagation direction of an acoustic wave excited by the IDT confines the acoustic wave around the IDT. It has been known that regions with different acoustic velocities of acoustic waves are periodically arranged at regular intervals in the extension direction of the electrode fingers in the SAW resonator as disclosed in, for example, International Publication No. 2015/007319.

When regions with different acoustic velocities of acoustic waves are located at regular intervals, lateral-mode spurious is reduced. However, a large emphasis mode occurs. In the multiplexer, the emphasis mode may overlap with the passband or attenuation region of other filters.

SUMMARY OF THE INVENTION

According to a first aspect of the present invention, there is provided a multiplexer including: a first filter including one or more series resonators connected in series between a common terminal and a first terminal and one or more parallel resonators connected in parallel between the common terminal and the first terminal, each of the one or more series resonators and the one or more parallel resonators including an IDT located on a piezoelectric substrate, a first region and a second region being alternately located in an extension direction of electrode fingers, which excite an acoustic wave, within an overlap region of the IDT, a width of at least one of the electrode fingers in the second region being greater than the width of the at least one of the electrode fingers in the first region, the electrode fingers overlapping in the overlap region, one or some resonators of the one or more parallel resonators and the one or more series resonators have a larger number of the second regions than a remaining resonator of the one or more parallel resonators and the one or more series resonators; and a second filter connected between the common terminal and a second terminal, the second filter having a passband higher than a passband of the first filter.

According to a second aspect of the present invention, there is provided a multiplexer including: a first filter including one or more series resonators connected in series between a common terminal and a first terminal and one or more parallel resonators connected in parallel between the common terminal and the first terminal, each of the one or more series resonators and the one or more parallel resonators including an IDT located on a piezoelectric substrate, a first region and a second region being alternately located in an extension direction of electrode fingers, which excite an acoustic wave, within an overlap region of the IDT, a thickness of an additional film located on at least one of the electrode fingers in the second region being greater than the thickness of the additional film located on the at least one of the electrode fingers in the first region, the electrode fingers overlapping in the overlap region, one or some resonators of the one or more parallel resonators and the one or more series resonators have a larger number of the second regions than a remaining resonator of the one or more parallel resonators and the one or more series resonators; and a second filter connected between the common terminal and a second terminal, the second filter having a passband higher than a passband of the first filter.

According to a third aspect of the present invention, there is provided a multiplexer including: a first filter including one or more series resonators connected in series between a common terminal and a first terminal and one or more parallel resonators connected in parallel between the common terminal and the first terminal, each of the one or more series resonators and the one or more parallel resonators including an IDT located on a piezoelectric substrate, a first region and a second region being alternately located in an extension direction of electrode fingers, which excite an acoustic wave, within an overlap region of the IDT, an acoustic velocity in the second region being less than the acoustic velocity in the first region, the electrode fingers overlapping in the overlap region, one or some resonators of the one or more parallel resonators and the one or more series resonators have a larger number of the second regions than a remaining resonator of the one or more parallel resonators and the one or more series resonators; and a second filter connected between the common terminal and a second terminal, the second filter having a passband higher than a passband of the first filter.

DETAILED DESCRIPTION

Figure 1A:
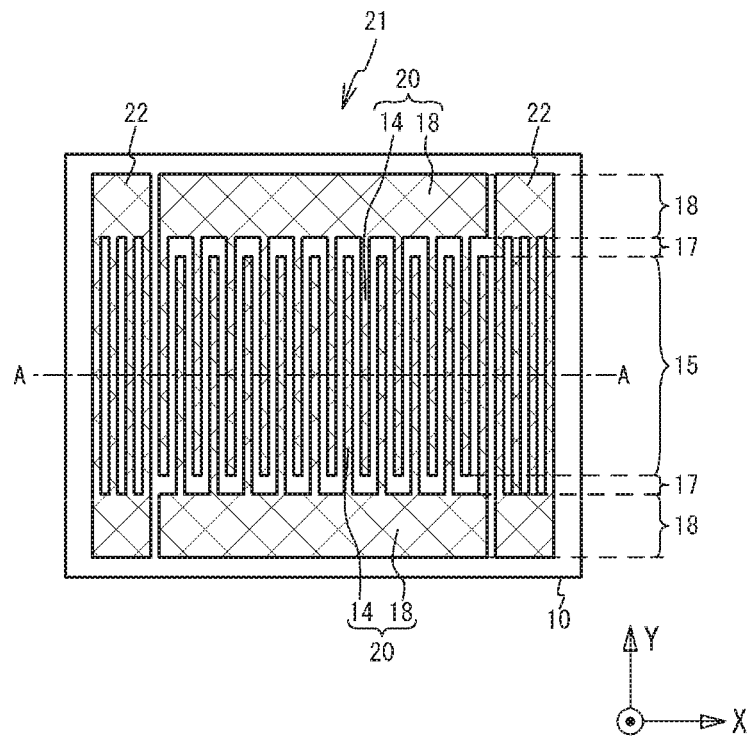
FIG. 1A is a plan view of an acoustic wave resonator in accordance with a comparative example and an embodiment.
Figure 1B:
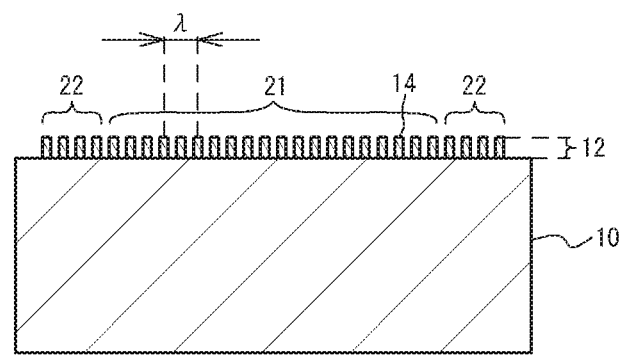
FIG. 1B is a cross-sectional view taken along line A-A in FIG. 1A.

A description will be given of a structure of a surface acoustic wave resonator. FIG. 1A is a plan view of a surface acoustic wave resonator in accordance with a comparative example and an embodiment, and FIG. 1B is a cross-sectional view taken along line A-A in FIG. 1A. As illustrated in FIG. 1A and FIG. 1B, an IDT 21 and reflectors 22 are located on a piezoelectric substrate 10. The IDT 21 and the reflectors 22 are formed of a metal film 12 formed on the piezoelectric substrate 10. The IDT 21 includes a pair of comb-shaped electrodes 20 facing each other. The comb-shaped electrode 20 includes a plurality of electrode fingers 14 and a bus bar 18 to which the electrode fingers 14 are coupled. The pair of comb-shaped electrodes 20 are arranged so as to face each other so that the electrode fingers 14 of one of the comb-shaped electrodes 20 are substantially alternated with the electrode fingers 14 of the other.

The region where the electrode fingers 14 of the pair of comb-shaped electrodes 20 overlap is an overlap region 15. In the overlap region 15, the acoustic wave excited by the electrode fingers 14 mainly propagates in the arrangement direction of the electrode fingers 14. The pitch of the electrode fingers 14 substantially correspond to the wavelength λ of the acoustic wave. The region between the ends of the electrode fingers 14 of one of the comb-shaped electrodes 20 and the bus bar 18 of the other of the comb-shaped electrodes 20 is a gap region 17. When dummy electrode fingers are located, the gap region is a region between the ends of the electrode fingers of one of the comb-shaped electrodes 20 and the ends of the dummy electrode fingers of the other. The propagation direction of the acoustic wave is defined as an X direction, and the direction perpendicular to the propagation direction is defined as a Y direction (the extension direction of the electrode finger 14). The X direction and the Y direction do not necessarily correspond to the X-axis orientation and the Y-axis orientation of the crystal orientation of the piezoelectric substrate 10. The piezoelectric substrate 10 is, for example, a lithium tantalate substrate or a lithium niobate substrate. The metal film 12 is, for example, an aluminum film or a copper film. The metal film 12 may be made of Al, Au, Cu, Cr, Ti, Ru, Mo, W, Ni, Ag, Ta, Zn, or Pt, or an alloy of at least two of them, or may be a multilayered film of at least two of them.

In the following description, a description will be given of a case where the anisotropy coefficient γ is positive. The anisotropy coefficient γ is determined by the material of the piezoelectric substrate 10 and the material, the film thickness, and the pitch of the IDT 21. For example, when the piezoelectric substrate 10 is a rotated Y-cut X-propagation lithium niobate substrate, the anisotropy coefficient γ is positive. When the piezoelectric substrate 10 is a rotated Y-cut X-propagation lithium tantalate substrate, the anisotropy coefficient γ is negative. When a rotated Y-cut X-propagation lithium tantalate substrate is used, the IDT 21 is made of a heavy material, and the film thickness is made to be large, the anisotropy coefficient γ may become positive.

Resonator R

Figure 2A:
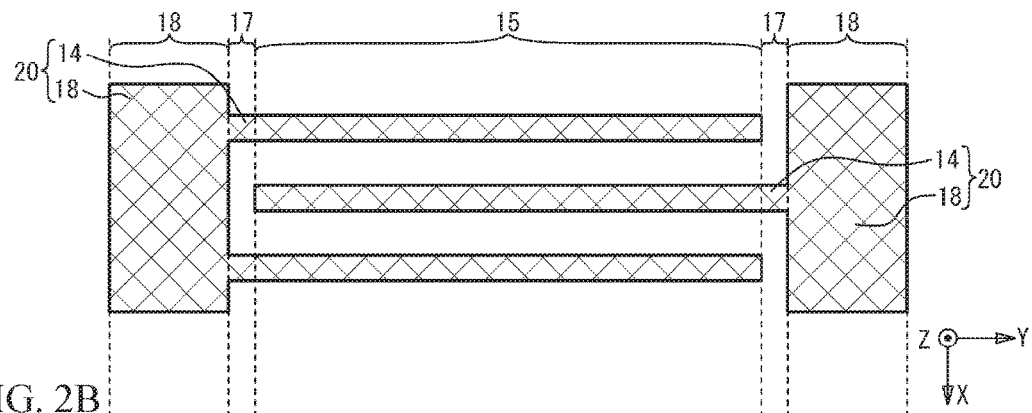
FIG. 2A is a plan view of a part of an acoustic wave resonator in accordance with a resonator R.
Figure 2B:
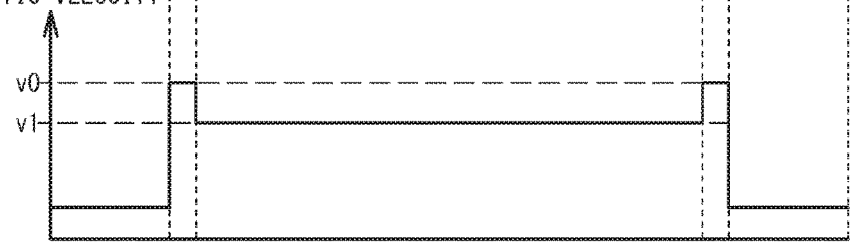
FIG. 2B illustrates acoustic velocity in each region.

FIG. 2A is a plan view of a part of an acoustic wave resonator in accordance with a resonator R, and FIG. 2B illustrates acoustic velocity in each region. The acoustic velocity of FIG. 2B represents the acoustic velocity of an acoustic wave propagating in the Y direction. However, since the acoustic velocity of the acoustic wave propagating in the X direction is proportional to the acoustic velocity of the acoustic wave propagating in the Y direction, the acoustic velocity of FIG. 2B may be considered as the acoustic velocity of the acoustic wave propagating in the X direction. The same applies to the drawings hereinafter. An acoustic velocity v0 in the gap region 17 is set faster than an acoustic velocity v1 in the overlap region 15. This setting causes the acoustic wave to be confined in the overlap region 15. However, when the standing wave of the acoustic wave propagating in the Y direction is formed in the overlap region 15, lateral-mode spurious occurs. Periodic lateral-mode spurious occurs at frequencies according to the order of the standing wave.

The acoustic velocity of the surface acoustic wave is made to be less than that of a transverse wave by adding a substance with a low acoustic velocity such as a silicon oxide film on the lithium tantalate substrate. This configuration theoretically reduces the loss caused by the conversion into a bulk wave to zero, reducing the loss. However, when the acoustic velocity of the surface acoustic wave is decreased, the lateral-mode spurious occurs.

Fabricated were resonators A through C for a transmit filter for Band28A (transmit band: 703 to 733 MHz, receive band: 758 to 788 MHz). The transmit filter was assumed to be a ladder-type filter including a series resonator and a parallel resonator, and the resonators A through C were fabricated as the parallel resonator of the transmit filter.

Resonator A

Figure 3A:
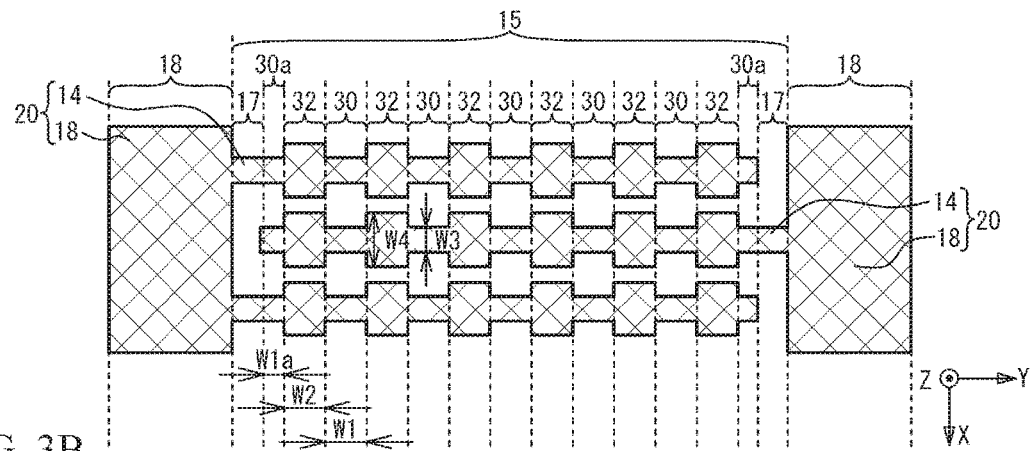
FIG. 3A is a plan view of a part of an acoustic wave resonator in accordance with a resonator A, and FIG. 3B and FIG. 3C respectively illustrate the acoustic velocity and the amplitude of an acoustic wave in an overlap region.
Figure 3B:
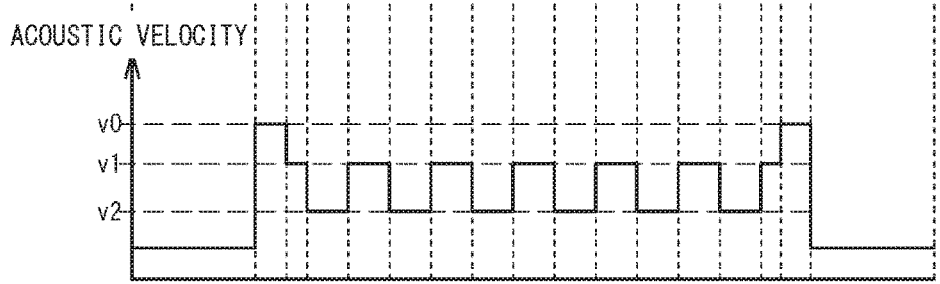
Figure 3C:
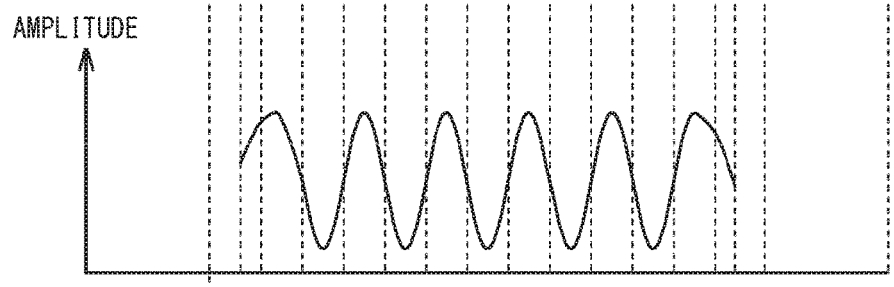

FIG. 3A is a plan view of a part of an acoustic wave resonator in accordance with the resonator A, and FIG. 3B and FIG. 3C respectively illustrate the acoustic velocity and the amplitude of an acoustic wave in the overlap region. As illustrated in FIG. 3A, first regions 30 and second regions 32 are alternately located in the Y direction. The number of the second regions 32 is six. The outermost regions in the Y direction are first regions 30a. The widths in the Y direction of the first regions 30 and 30a and the second region 32 are respectively W1, W1a, and W2. The width of the electrode finger 14 in the first regions 30 and 30a is W3, and the width of the electrode finger 14 in the second region 32 is W4. W4 is greater than W3.

As illustrated in FIG. 3B, as the electrode finger 14 becomes wider, the acoustic velocity of the acoustic wave becomes smaller. Thus, an acoustic velocity v2 in the second region 32 is less than the acoustic velocity v1 in the first regions 30 and 30a. As described, the first regions 30, in which the acoustic velocity is high, and the second regions 32, in which the acoustic velocity is low, are alternately located within the overlap region 15. As illustrated in FIG. 3C, the acoustic wave tends to concentrate in the second region 32 in which the acoustic velocity is low. Thus, as indicated by the solid line, the acoustic wave tends to form the antinode of the standing wave in the second region 32. Accordingly, a standing wave having six antinodes, which correspond to the number of the second regions 32, is formed, and standing waves in other orders are not formed.

Figure 4:
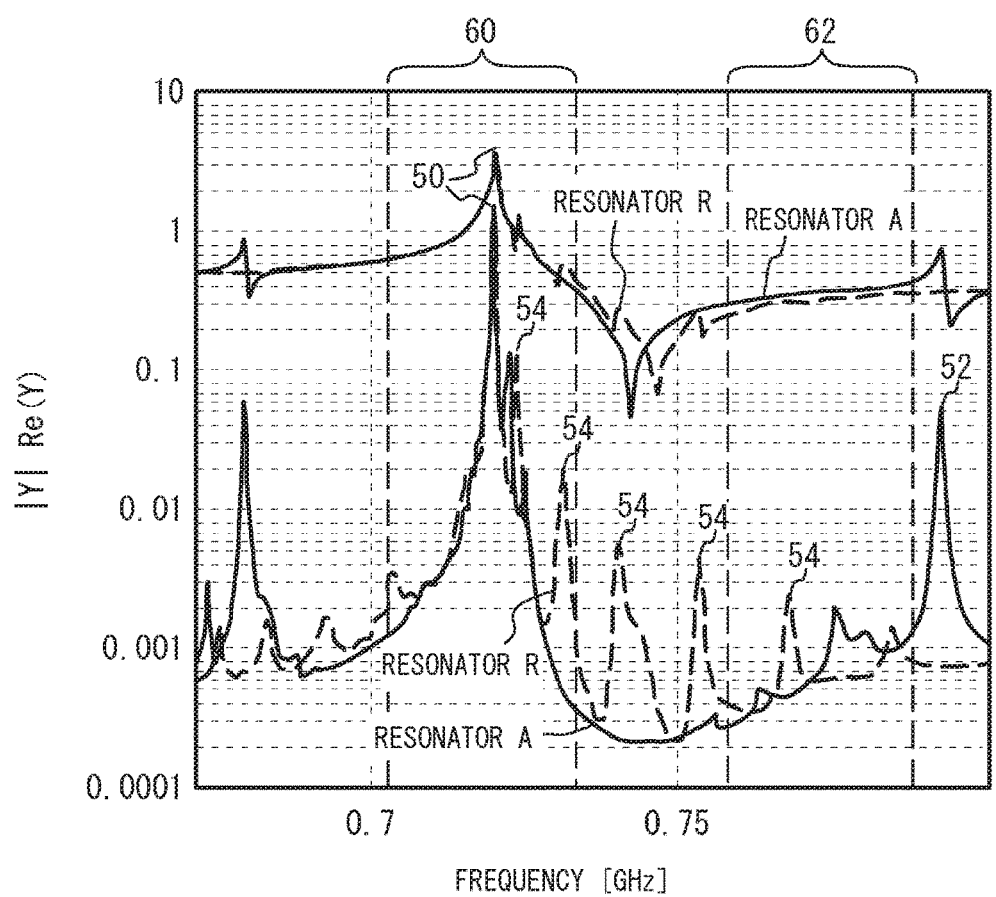
FIG. 4 is a graph of admittance versus frequency of the resonator A.

The fabrication conditions of the resonator A is as follows.
Piezoelectric substrate 10: 42° rotated Y-cut X-propagation lithium tantalate substrate
Pitch $\lambda$ of the IDT 21: 4.4 μm (corresponds to a resonant frequency of approximately 700 MHz)
Material of the IDT 21: Copper
Film thickness of the IDT 21: 0.1$\lambda$
Duty ratio of the first region 30: 40% (W3=1.76$\lambda$)
Duty ratio of the second region 32: 63% (W4=2.772$\lambda$)
Width W1 of the first region 30: 1.4$\lambda$
Width W1a of the first region 30a: 0.625$\lambda$
Width W2 of the second region 32: 1.48$\lambda$ FIG. 4 is a graph of admittance versus frequency of the resonator A. In FIG. 4, upper lines indicate the absolute value |Y| of admittance, and lower lines indicate the conductance component Re(Y) of admittance. The solid line indicates the admittance of the resonator A, and the dashed line indicates the admittance of the resonator R without the second region. A transmit band 60 and a receive band 62 are indicated.

As illustrated in FIG. 4, a peak 50 corresponds to the resonant frequency. The resonant frequencies of the resonators A and R are approximately the same. In the resonator R, a plurality of lateral-mode spuriouses 54 are observed around between the resonant frequency and the antiresonant frequency. The plurality of lateral-mode spuriouses 54 have different orders of standing waves. In the resonator A, lateral-mode spurious is hardly observed around the resonant frequency. An emphasis mode 52 is observed around a frequency higher than the receive band 62. The emphasis mode 52 is a mode corresponding to the standing wave of FIG. 3C.

In the resonator A, the order of the standing wave is fixed as in FIG. 3C. Thus, a single emphasis mode occurs at a fixed frequency as illustrated in FIG. 4. Since it becomes difficult for standing waves other than the emphasis mode to exist, lateral-mode spurious other than the emphasis mode hardly occurs. Thus, the lateral-mode spurious is reduced. However, the emphasis mode 52 is located near the receive band 62, affecting the receive band 62.

Resonator B

Figure 5A:
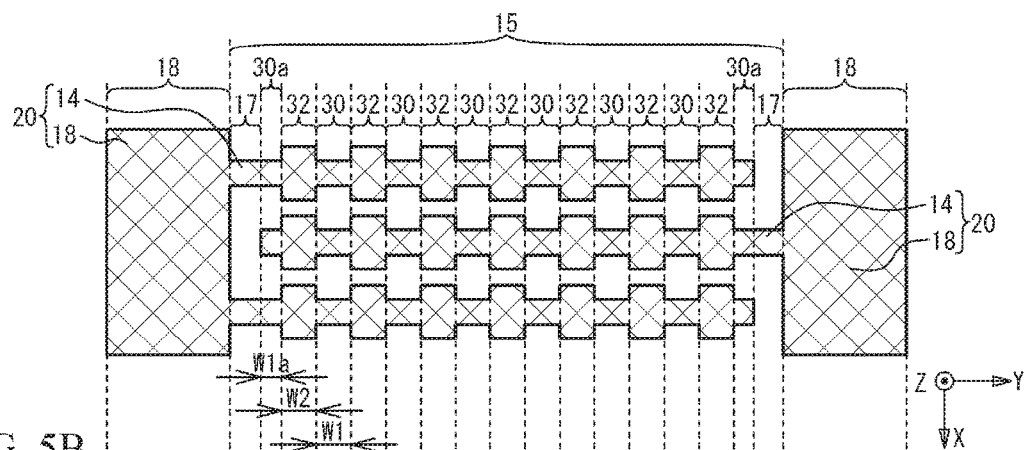
FIG. 5A is a plan view of a part of an acoustic wave resonator in accordance with a resonator B, and FIG. 5B and FIG. 5C respectively illustrate the acoustic velocity and the amplitude of the acoustic wave in the overlap region.
Figure 5B:
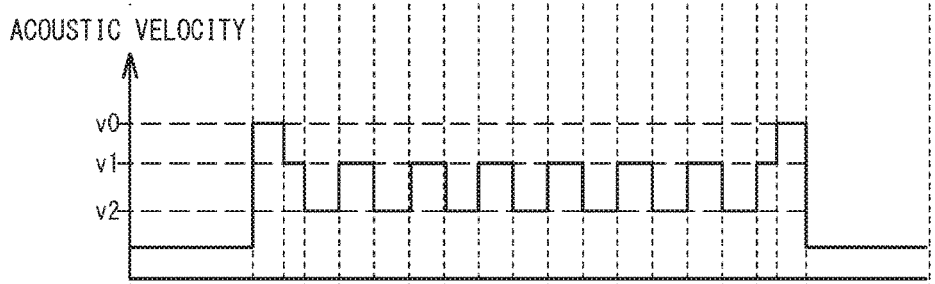
Figure 5C:
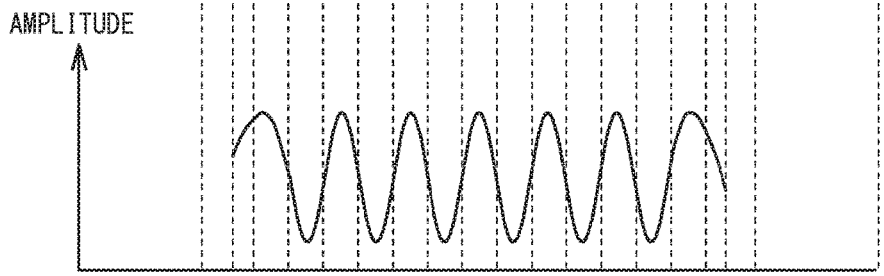

FIG. 5A is a plan view of a part of an acoustic wave resonator in accordance with the resonator B, and FIG. 5B and FIG. 5C respectively illustrate the acoustic velocity and the amplitude of the acoustic wave in the overlap region. As illustrated in FIG. 5A and FIG. 5B, seven second regions 32 are located. As illustrated in FIG. 5C, a standing wave having seven antinodes, which correspond to the number of the second regions 32, is formed, and standing waves in other orders are not formed.

Figure 6:
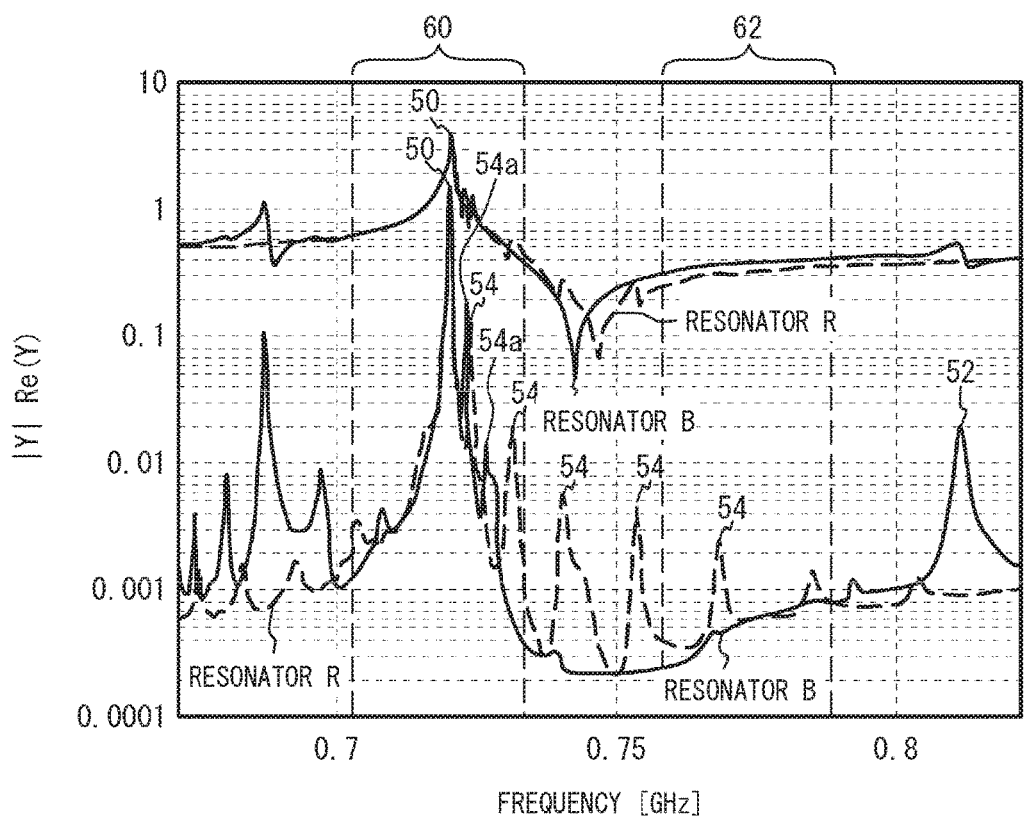
FIG. 6 is a graph of admittance versus frequency of the resonator B.

The fabrication conditions of the resonator B is as follows.
Piezoelectric substrate 10: 42° rotated Y-cut X-propagation lithium tantalate substrate
Pitch $\lambda$ of the IDT 21: 4.4 μm (corresponds to a resonant frequency of approximately 700 MHz)
Material of the IDT 21: Copper
Film thickness of the IDT 21: 0.1$\lambda$
Duty ratio of the first region 30: 30% (W3=1.32$\lambda$)
Duty ratio of the second region 32: 53% (W4=2.332$\lambda$)
Width W1 of the first region 30: 1.7$\lambda$
Width W1a of the first region 30a: 0.625$\lambda$
Width W2 of the second region 32: 1.7$\lambda$ FIG. 6 is a graph of admittance versus frequency of the resonator B. As illustrated in FIG. 6, the resonant frequencies of the resonator B and the resonator A are approximately the same. The frequency of the emphasis mode 52 of the resonator B shifts to a frequency higher than that of the resonator A, and is located away from the receive band 62. Lateral-mode spurious 54a near the resonant frequency of the resonator B is slightly greater than that of the resonator A.

Resonator C

Figure 7A:
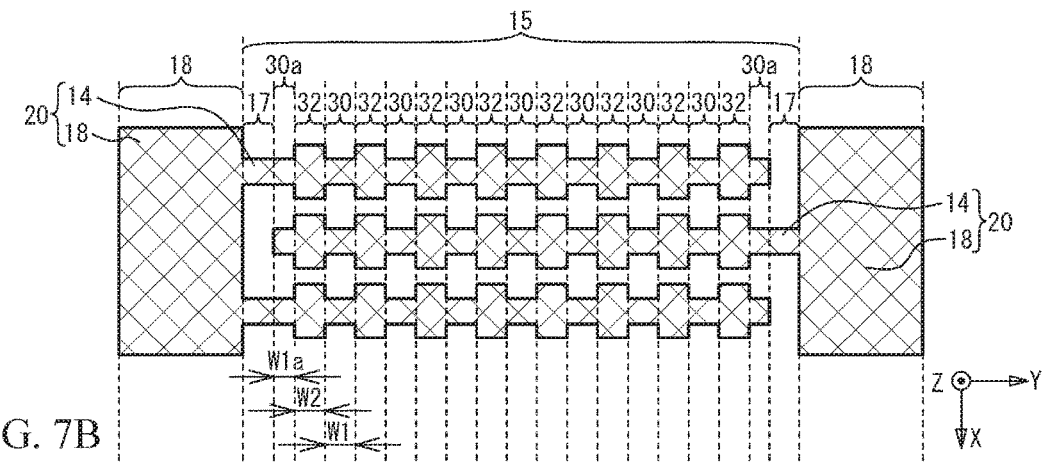
FIG. 7A is a plan view of a part of an acoustic wave resonator in accordance with a resonator C, and FIG. 7B and FIG. 7C respectively illustrate the acoustic velocity and the amplitude of the acoustic wave in the overlap region.
Figure 7B:
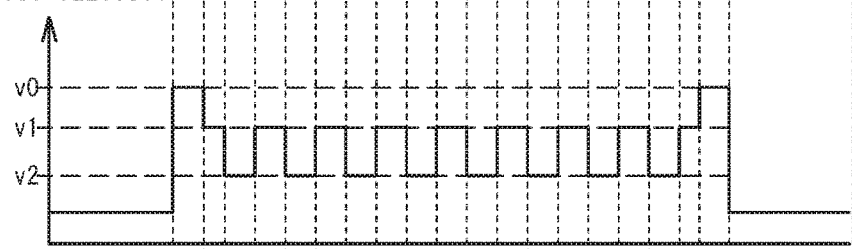
Figure 7C:
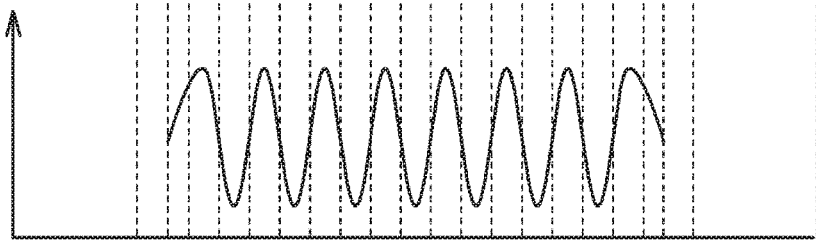

FIG. 7A is a plan view of a part of an acoustic wave resonator in accordance with the resonator C, and FIG. 7B and FIG. 7C respectively illustrate the acoustic velocity and the amplitude of the acoustic wave in the overlap region. As illustrated in FIG. 7A and FIG. 7B, eight second regions 32 are located. As illustrated in FIG. 7C, a standing wave having eight antinodes, which correspond to the number of the second regions 32, is formed, and standing waves in other orders are not formed.

Figure 8:
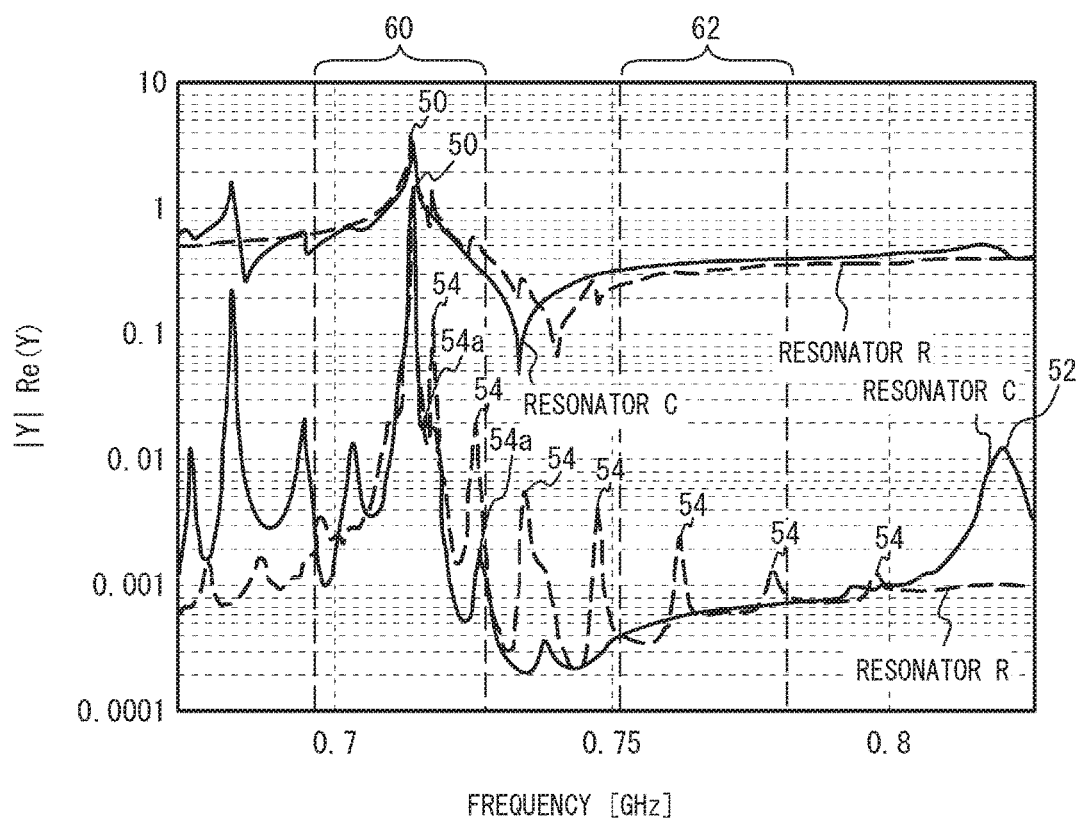
FIG. 8 is a graph of admittance versus frequency of the resonator C.

The fabrication conditions of the resonator C is as follows.
Piezoelectric substrate 10: 42° rotated Y-cut X-propagation lithium tantalate substrate
Pitch $\lambda$ of the IDT 21: 4.4 μm (corresponds to a resonant frequency of approximately 700 MHz)
Material of the IDT 21: Copper
Film thickness of the IDT 21: 0.1$\lambda$
Duty ratio of the first region 30: 30% (W3=1.32$\lambda$)
Duty ratio of the second region 32: 65% (W4=2.86$\lambda$)
Width W1 of the first region 30: 1.25$\lambda$
Width W1a of the first region 30a: 0.625$\lambda$
Width W2 of the second region 32: 1.25$\lambda$ FIG. 8 is a graph of admittance versus frequency of the resonator C. As illustrated in FIG. 6, the resonant frequency is approximately the same as those of the resonators A and B. The frequency of the emphasis mode 52 shifts to a frequency higher than that of the resonator B, and is located further away from the receive band 62. The lateral-mode spurious 54a is greater than that of the resonator B.

As described with the resonators A through C, as the number of the second regions 32 is increased, the frequency of the emphasis mode 52 increases. However, the lateral-mode spurious becomes larger. Among the resonators A through C, for the convenience of fabrication, the duty ratio and the widths W1 and W2 differ from each other in addition to the number of the second regions 32. The emphasis mode 52 and the lateral-mode spurious 54a are due to the standing wave within the overlap region 15. Thus, the duty ratio, the widths W1 and W2, the emphasis mode 52, and the lateral-mode spurious 54a have little effect on the emphasis mode 52 and the lateral-mode spurious 54a.

Figure 9:
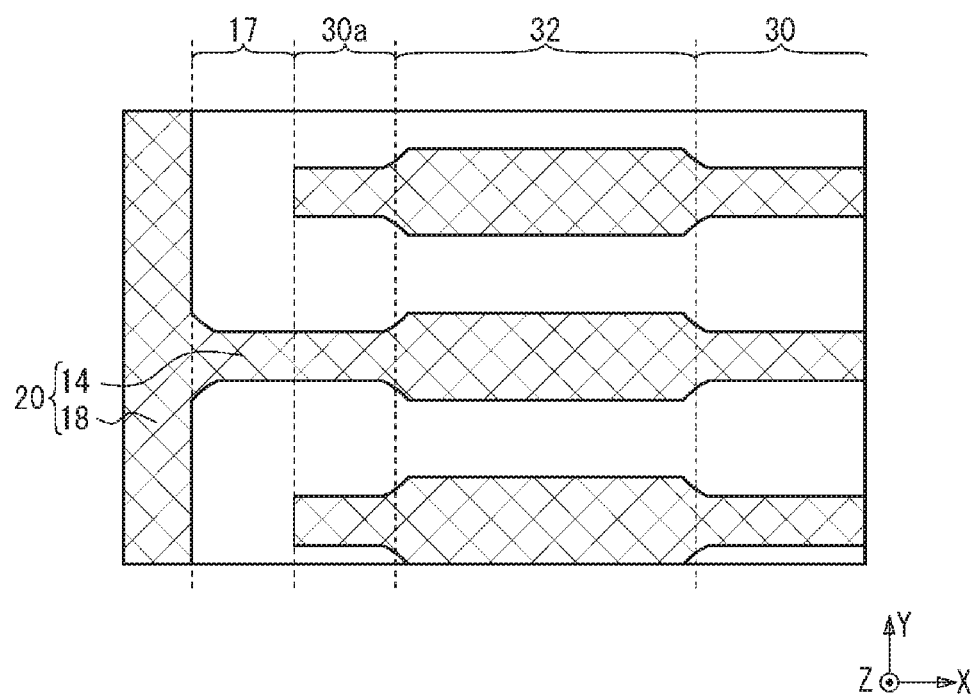
FIG. 9 is a plan view around a second region of a fabricated resonator.

FIG. 9 is a plan view around the second region of the fabricated resonator. As illustrated in FIG. 9, when the resonators A through C are fabricated, the corner of the electrode finger 14 round. The width of the electrode finger 14 continuously changes in the Y direction. As described above, the width of the electrode finger 14 between the first regions 30 and 30a and the second region 32 may not be necessarily discontinuous like FIG. 3A.

First Embodiment

Figure 10:
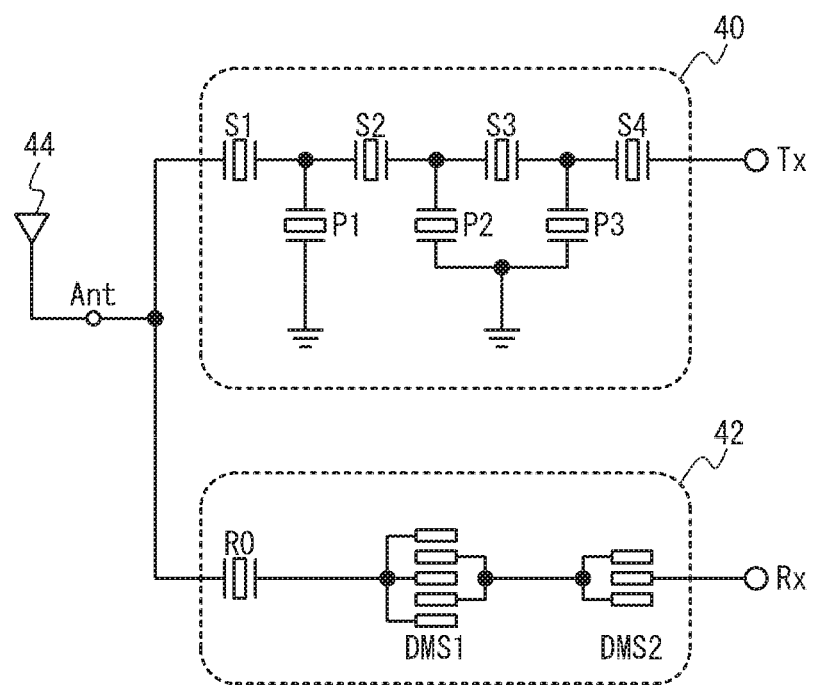
FIG. 10 is a circuit diagram of a duplexer in accordance with a first embodiment.

Based on findings from the resonators A through C, a description will be given of a duplexer in accordance with an embodiment. FIG. 10 is a circuit diagram of a duplexer in accordance with a first embodiment. As illustrated in FIG. 10, a transmit filter 40 is connected between a common terminal Ant and a transmit terminal Tx. A receive filter 42 is connected between the common terminal Ant and a receive terminal Rx. An antenna 44 is connected to the common terminal Ant. The transmit filter 40 transmits signals in the transmit band to the common terminal Ant among high-frequency signals input from the transmit terminal Tx, and suppresses signals with other frequencies. The receive filter 42 transmits signals in the receive band to the receive terminal Rx among high-frequency signals input from the common terminal Ant, and suppresses signals with other frequencies.

The transmit filter 40 is a ladder-type filter, and includes series resonators S1 through S4 and parallel resonators P1 through P3. The series resonators S1 through S4 are connected in series between the common terminal Ant and the transmit terminal Tx. The parallel resonators P1 through P3 are connected in parallel between the common terminal Ant and the transmit terminal Tx. The receive filter 42 includes a one-port resonator R0, and multimode filters DMS1 and DMS2. Between the common terminal Ant and the receive terminal Rx, the resonator R0, the DMS1 and the DMS2 are connected in this order from the common terminal side.
Duplexer D Simulated was a transmission characteristic of a duplexer D assumed to have a structure using the resonator B having seven second regions 32 for the parallel resonators P1 through P3 of the transmit filter 40 and the resonator A having six second regions 32 for the series resonators S1 through S4. Simulation conditions are as follows.
Series Resonators S1 Through S4
  Pitch $\lambda$ of the IDT: 4.4 μm
  Duty ratio of the first region 30: 35%
  Duty ratio of the second region 32: 60%
  Number of the second regions 32: 6
  Other conditions are the same as those of the resonator A.
Parallel Resonators P1 Through P3
  Pitch $\lambda$ of the IDT: 4.4 μm
  Duty ratio of the first region 30: 35%
  Duty ratio of the second region 32: 65%
  Number of the second regions 32: 7
  Other conditions are the same as those of the resonator B.
Receive filter 42: Filter having the transmission characteristic of FIG. 11

Figure 11:
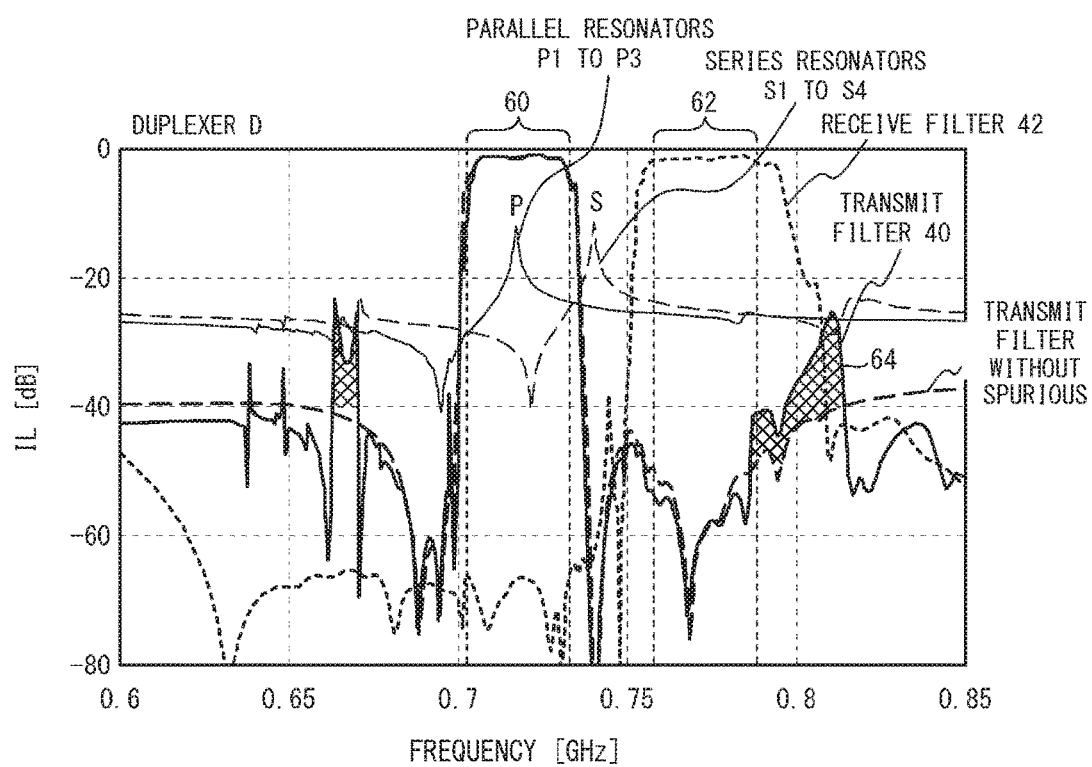
FIG. 11 illustrates transmission characteristics of parallel resonators, series resonators, a transmit filter, and a receive filter in a duplexer D.

FIG. 11 illustrates transmission characteristics of the parallel resonators, the series resonators, the transmit filter, and the receive filter in the duplexer D. In FIG. 11, the thin solid line and the thin dashed line respectively indicate the transmission characteristics of the parallel resonators P1 through P3 and the series resonators S1 through S4. The solid line indicates the passband from the transmit terminal Tx to the common terminal Ant of the transmit filter 40. The dashed line indicates the passband from the transmit terminal Tx to the common terminal Ant of the transmit filter when the lateral-mode spurious and the emphasis mode are not taken into account. The dotted line indicates the transmission characteristic from the common terminal Ant to the receive terminal Rx of the receive filter 42. Hatched area 64 indicate a difference between the transmit filter 40 and a transmit filter without spurious taken into account.

As illustrated in FIG. 11, the resonant frequencies of the parallel resonators P1 through P3 are less than the resonant frequencies of the series resonators S1 through S4. The passband of the transmit filter 40 corresponds to the transmit band 60, and the passband of the receive filter 42 corresponds to the receive band 62. As indicated by the areas 64, the attenuation characteristic of the transmit filter 40 deteriorates at frequencies higher than the receive band 62 compared to the transmit filter without spurious taken into account. The area 64 is considered to be due to the emphasis mode 52 of the resonator B.

For example, when the resonator A is used as the parallel resonators P1 through P3 of the transmit filter 40, the area 64 due to the emphasis mode 52 shifts to a lower frequency, and the attenuation characteristic of the transmit filter 40 within the receive band 62 deteriorates. As described above, use of the resonator B as the parallel resonators P1 through P3 improves the attenuation characteristic of the transmit filter 40 in the receive band 62. The resonant frequencies of the series resonators S1 through S4 are higher than those of the parallel resonators P1 through P3. Thus, even when the resonator A is used as the series resonators S1 through S4, the emphasis mode 52 does not affect the receive band 62. On the other hand, when the resonator B is used as the series resonators S1 through S4, the lateral-mode spurious 54a becomes large. In the duplexer D, by using the resonator B as the parallel resonators P1 through P3 and using the resonator A as the series resonators S1 through S4, the attenuation characteristic of the receive band is improved and the lateral-mode spurious is reduced.
Duplexer E Simulated was the transmission characteristic of a duplexer E assumed to have a structure using the resonator C having eight second regions 32 for the parallel resonators P1 through P3 of the transmit filter 40 and the resonator A for the series resonators S1 through S4. Simulation conditions are as follows.
Series Resonators S1 Through S4
  Pitch $\lambda$ of the IDT: 4.4 μm
  Duty ratio of the first region 30: 35%
  Duty ratio of the second region 32: 60%
  Number of the second regions 32: 6
  Other conditions are the same as those of the resonator A.
Parallel Resonators P1 Through P3
  Pitch $\lambda$ of the IDT: 4.4 μm
  Duty ratio of the first region 30: 30%
  Duty ratio of the second region 32: 65%
  Number of the second regions 32: 8
  Other conditions are the same as those of the resonator C.

Figure 12:
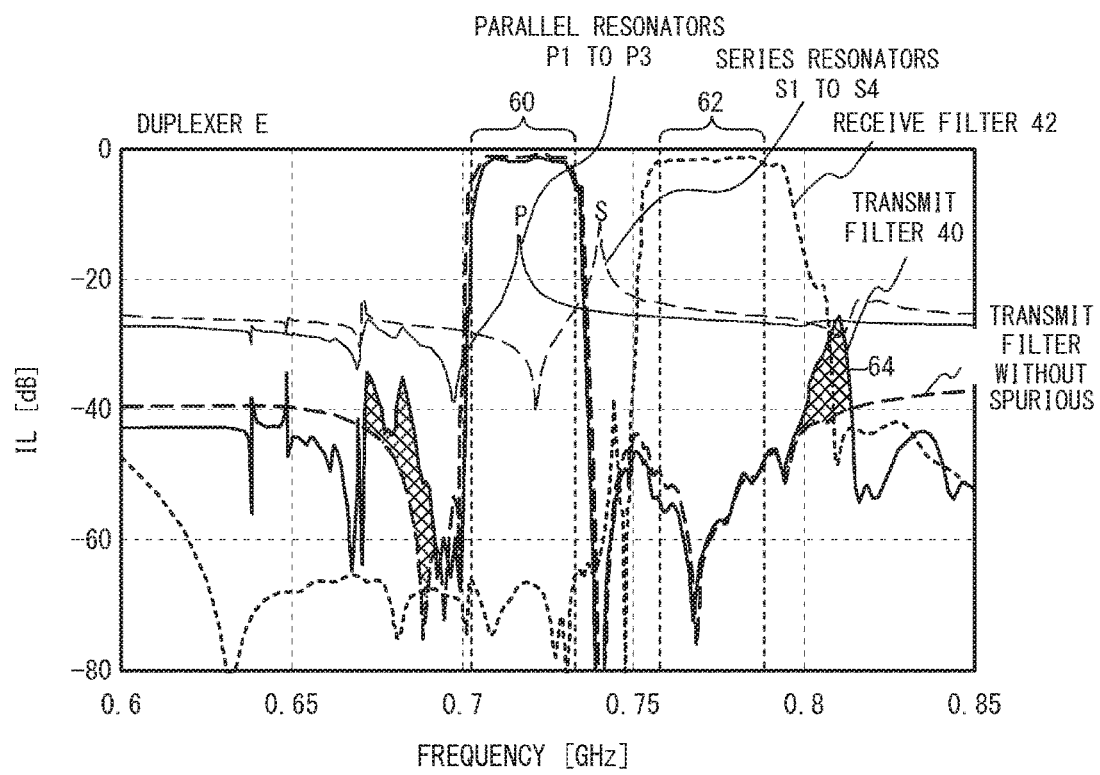
FIG. 12 illustrates transmission characteristics of parallel resonators, series resonators, a transmit filter, and a receive filter in a duplexer E.

FIG. 12 illustrates transmission characteristics of the parallel resonators, the series resonators, the transmit filter, and the receive filter in the duplexer E. As illustrated in FIG. 12, the resonant frequencies of the parallel resonators P1 through P3 and the series resonators S1 through S4 are approximately the same as those in the duplexer D. The areas 64 are located at frequencies higher than those of the duplexer D. This is because the emphasis mode of the resonator C is formed at a frequency higher than that of the emphasis mode 52 of the resonator B. The duplexer E improves the attenuation characteristic of the transmit filter 40 in the receive band more than the duplexer D.

The transmit filter 40 (a first filter) is connected between the common terminal Ant and the transmit terminal Tx, and the receive filter 42 (a second filter) is connected between the common terminal Ant and the receive terminal Rx. In such a duplexer, if the emphasis modes 52 of the series resonators S1 through S4 and the parallel resonators P1 through P3 of the transmit filter 40 are located near the receive band 62 of the receive filter 42, the attenuation characteristic of the transmit filter 40 near the receive band 62 deteriorates.

Thus, in the first embodiment, each of the series resonators S1 through S4 and the parallel resonators P1 through P3 of the transmit filter 40 includes an IDT in which the first regions 30 and the second regions 32 are alternately located in the Y direction within the overlap region 15. One or some resonators of the parallel resonators P1 through P3 and the series resonators S1 through S4 have a larger number of the second regions 32 than the remaining resonator. This structure increases the number of the second regions 32 of the one or some resonators of which the emphasis modes 52 are formed near the receive band 62, shifting the emphasis mode 52 to a higher frequency. Accordingly, the deterioration of the attenuation characteristic due to the emphasis mode 52 within the receive band 62 is reduced. The number of the second regions 32 of the remaining resonator of which the emphasis mode 52 is not formed near the receive band 62 is not increased. This configuration can reduce the lateral-mode spurious 54a formed when the number of the second regions 32 increases.

In the ladder-type resonator, the resonant frequencies of the parallel resonators P1 through P3 are less than those of the series resonators S1 through S4. Thus, the emphasis modes 52 of the parallel resonators P1 through P3 easily affect the attenuation characteristics near the receive band 62. Thus, the number of the second regions 32 of at least one of the parallel resonators P1 through P3 is made to be greater than the number of the second regions 32 of the remaining resonators. This configuration shifts the emphasis mode 52 of the resonator that affects the deterioration of the attenuation characteristic near the receive band 62 to a higher frequency. Thus, the deterioration of the attenuation characteristic due to the emphasis mode 52 is further reduced.

As the number of the second regions 32 is increased, the spurious 54a more easily occurs. Thus, the number of the second regions 32 in one or some resonators of the parallel resonators P1 through P3 is made to be greater than that in the remaining resonator of the parallel resonators P1 through P3. Accordingly, only the number of the second regions 32 of the resonator of which the emphasis mode affects the receive band is increased among parallel resonators. The effect of the spurious 54a can be reduced by reducing the number of the second regions 32 of the remaining resonator.

When the parallel resonators P1 through P3 have different resonant frequencies, the emphasis mode 52 of the resonator with the lowest resonant frequency easily affects the attenuation characteristic near the receive band 62. Thus, the resonator of which the number of the second regions 32 is increased preferably includes the resonator with the lowest resonant frequency among the parallel resonators P1 through P3. In addition, the emphasis mode 52 of the resonator with the highest resonant frequency hardly affects the attenuation characteristic near the receive band 62. Thus, the resonator of which the number of the second regions 32 is reduced preferably includes the resonator with the highest resonant frequency among the parallel resonators P1 through P3.

Furthermore, the emphasis mode of the resonator with a larger number of the second regions 32 is located at a frequency higher than the passband of the receive filter 42.

Thus, the deterioration of the attenuation characteristic due to the emphasis mode 52 within the receive band 62 is reduced.

The number of the second regions 32 may differ among the parallel resonators P1 through P3. The number of the second regions 32 may differ among the series resonators S1 through S4. The parallel resonators P1 through P3 may have the same number of the second regions 32, and the series resonators S1 through S4 may have the same number of the second regions 32.

It is sufficient if the electrode finger 14 in the second region 32 is wider than the electrode finger 14 in the first regions 30 and 30a in at least one of the electrode fingers 14. It is preferable that the electrode finger 14 in the second region 32 is wider than the electrode finger 14 in the first regions 30 and 30a in 50% or more of the electrode fingers 14. It is more preferable that the electrode finger 14 in the second region 32 is wider than the electrode finger 14 in the first regions 30 and 30a in all the electrode fingers 14.

Second Embodiment

Figures 13A, 13B:
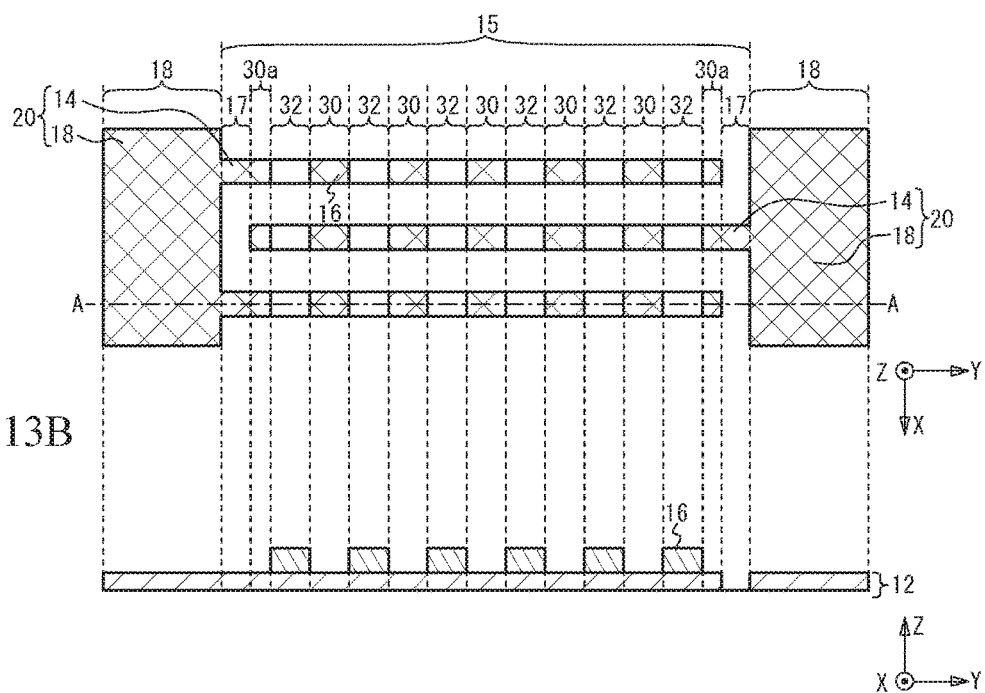
FIG. 13A is a plan view of a part of an acoustic wave resonator in accordance with a resonator F in a second embodiment.
FIG. 13B is a cross-sectional view taken along line A-A in FIG. 13A.

FIG. 13A is a plan view of a part of an acoustic wave resonator in accordance with a resonator F in a second embodiment, and FIG. 13B is a cross-sectional view taken along line A-A in FIG. 13A. As illustrated in FIG. 13A and FIG. 13B, the number of the second regions 32 is six. In the second region 32, an additional film 16 is located on the electrode finger 14. In the first regions 30 and 30a, no additional film 16 is formed on the electrode finger 14. When the additional film 16 is formed on the electrode finger 14, the acoustic velocity of the acoustic wave decreases. Thus, the acoustic velocity and the amplitude of the acoustic wave in the first regions 30 and 30a and the second region 32 become the same as those in FIG. 3B and FIG. 3C. The additional film 16 may be made of a metal material such as copper, chrome, tungsten, aluminum, or ruthenium, or an insulating material such as silicon nitride, silicon oxide, aluminum oxide, or tantalum oxide. The additional film 16 and the electrode finger 14 may be made of the same material. Other configurations are the same as those of the resonator A in the first embodiment, and the description thereof is thus omitted.

Figure 14A:
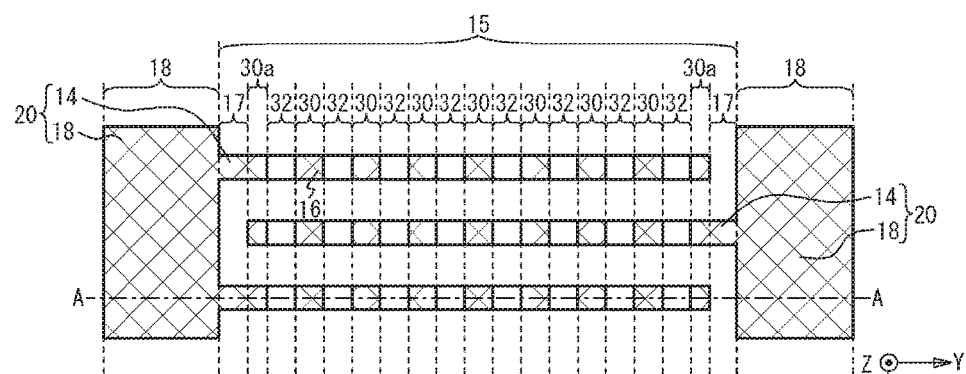
FIG. 14A is a plan view of a part of an acoustic wave resonator in accordance with a resonator G in the second embodiment.
Figure 14B:
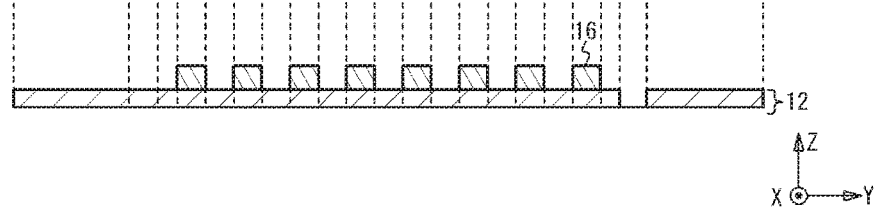
FIG. 14B is a cross-sectional view taken along line A-A in FIG. 14A.

FIG. 14A is a plan view of a part of an acoustic wave resonator in accordance with a resonator G in the second embodiment, and FIG. 14B is a cross-sectional view taken along line A-A in FIG. 14A. As illustrated in FIG. 14A and FIG. 14B, the number of the second regions 32 is eight. The acoustic velocity and the amplitude of an acoustic wave in the first regions 30 and 30a and the second region 32 are the same as those in FIG. 5B and FIG. 5C. Other configurations are the same as those of the resonator F, and the description thereof is thus omitted.

As in the first embodiment, the resonator G is used for the parallel resonators P1 through P3 of the duplexer E, and the resonator F is used for the series resonators S1 through S4. This configuration allows the characteristics that are the same as those of the duplexer E of the first embodiment to be obtained.

As described in the second embodiment, each of the series resonators S1 through S4 and the parallel resonators P1 through P3 includes an IDT in which the first regions 30 and the second regions 32, in which the additional film 16 located on the electrode finger 14 has a greater film thickness than the additional film 16 in the first region 30, are alternately arranged in the Y direction within the overlap region 15. One or some resonators of the parallel resonators P1 through P3 and the series resonators S1 through S4 have a larger number of the second regions 32 than the remaining resonator. This structure reduces the lateral-mode spurious and the effect of the emphasis mode as in the first embodiment.

In the second embodiment, it is sufficient if the film thickness of the additional film 16 located on the electrode finger in the second region 32 is greater than the film thickness of the additional film 16 located on the electrode finger 14 in the first regions 30 and 30a in at least one of the electrode fingers 14. It is preferable that the film thickness of the additional film 16 located on the electrode finger 14 in the second region 32 is greater than the film thickness of the additional film 16 located on the electrode finger 14 in the first regions 30 and 30a in 50% or greater of the electrode fingers 14. It is more preferable that the film thickness of the additional film 16 located on the electrode finger 14 in the second region 32 is greater than the film thickness of the additional film 16 located on the electrode finger 14 in the first regions 30 and 30a in all the electrode fingers 14.

The acoustic velocity in the second region 32 may be made to be less than that in the first regions 30 and 30a by a method other than the methods of the first and second embodiments.

In the first and second embodiments, the number of the series resonators S1 through S4 is one or more, and is freely selected. The number of the parallel resonators P1 through P3 is one or more, and is freely selected. An exemplary case where the first filter and the second filter are respectively a transmit filter and a receive filter is described, but the first filter and the second filter may be respectively a receive filter and a transmit filter. A filter for Band28A is described as an example, but the filter may be a filter for other bands such as Band28B (transmit band: 718 to 748 MHz, receive band: 773 to 803 MHz). A duplexer is described as an example of the multiplexer, but the multiplexer may be a triplexer or a quadplexer.

An exemplary case where the widths W1 of the first regions 30 are the same, and the widths W2 of the second regions 32 are the same is described, but the widths of the first regions 30 may differ from each other. The widths W2 of the second regions 32 may differ from each other. An exemplary case where the first region 30a is located in the outermost of the electrode finger 14 is described, but the first region 30a may not be necessarily located. That is, the outermost region may be the second region 32.

An exemplary case where the piezoelectric substrate 10 is a lithium tantalate substrate is described, but the piezoelectric substrate 10 may be other piezoelectric substrates such as a lithium niobate substrate.

Although the embodiments of the present invention have been described in detail, it is to be understood that the various change, substitutions, and alterations could be made hereto without departing from the spirit and scope of the invention.

What is claimed is:

1. A multiplexer comprising:
    a first filter including one or more series resonators connected in series between a common terminal and a first terminal and one or more parallel resonators connected in parallel between the common terminal and the first terminal, each of the one or more series resonators and the one or more parallel resonators including an IDT located on a piezoelectric substrate, a first region and a second region being alternately located in an extension direction of electrode fingers, which excite an acoustic wave, within an overlap region of the IDT, a width of at least one of the electrode fingers in the second region being greater than the width of the at least one of the electrode fingers in the first region, the electrode fingers overlapping in the overlap region, one or some resonators of the one or more parallel resonators and the one or more series resonators having a larger number of the second regions than one or more remaining resonators of the one or more parallel resonators and the one or more series resonators; and
    a second filter connected between the common terminal and a second terminal, the second filter having a passband higher than a passband of the first filter,
    wherein an emphasis mode of each of the one or some resonators is located at a frequency higher than the passband of the second filter.

2. The multiplexer according to claim 1, wherein the one or some resonators are at least one of the one or more parallel resonators.

3. The multiplexer according to claim 2, wherein the one or some resonators include a resonator with a lowest resonant frequency among the one or more parallel resonators.

4. The multiplexer according to claim 3, wherein the one or more remaining resonators include a resonator with a highest resonant frequency among the one or more parallel resonators.

5. The multiplexer according to claim 2, wherein the at least one of the one or more parallel resonators is the one or more remaining resonators.

6. The multiplexer according to claim 1, wherein the one or some resonators are the one or more parallel resonators, and the one or more remaining resonators are the one or more series resonators.

7. A multiplexer comprising:
    a first filter including one or more series resonators connected in series between a common terminal and a first terminal and one or more parallel resonators connected in parallel between the common terminal and the first terminal, each of the one or more series resonators and the one or more parallel resonators including an IDT located on a piezoelectric substrate, a first region and a second region being alternately located in an extension direction of electrode fingers, which excite an acoustic wave, within an overlap region of the IDT, a thickness of an additional film located on at least one of the electrode fingers in the second region being greater than the thickness of the additional film located on the at least one of the electrode fingers in the first region, the electrode fingers overlapping in the overlap region, one or some resonators of the one or more parallel resonators and the one or more series resonators having a larger number of the second regions than one or more remaining resonators of the one or more parallel resonators and the one or more series resonators; and
    a second filter connected between the common terminal and a second terminal, the second filter having a passband higher than a passband of the first filter,
    wherein an emphasis mode of each of the one or some resonators is located at a frequency higher than the passband of the second filter.

8. The multiplexer according to claim 7, wherein the one or some resonators are at least one of the one or more parallel resonators.

9. The multiplexer according to claim 8, wherein
the one or some resonators include a resonator with a lowest resonant frequency among the one or more parallel resonators.

10. The multiplexer according to claim 9, wherein
the one or more remaining resonators include a resonator with a highest resonant frequency among the one or more parallel resonators.

11. The multiplexer according to claim 8, wherein the at least one of the one or more parallel resonators is the one or more remaining resonators.

12. The multiplexer according to claim 7, wherein the one or some resonators are the one or more parallel resonators, and the one or more remaining resonators are the one or more series resonators.

13. A multiplexer comprising:
a first filter including one or more series resonators connected in series between a common terminal and a first terminal and one or more parallel resonators connected in parallel between the common terminal and the first terminal, each of the one or more series resonators and the one or more parallel resonators including an IDT located on a piezoelectric substrate, a first region and a second region being alternately located in an extension direction of electrode fingers, which excite an acoustic wave, within an overlap region of the IDT, an acoustic velocity in the second region being less than the acoustic velocity in the first region, the electrode fingers overlapping in the overlap region, one or some resonators of the one or more parallel resonators and the one or more series resonators having a larger number of the second regions than one or more remaining resonators of the one or more parallel resonators and the one or more series resonators; and
a second filter connected between the common terminal and a second terminal, the second filter having a passband higher than a passband of the first filter,
wherein an emphasis mode of each of the one or some resonators is located at a frequency higher than the passband of the second filter.

14. The multiplexer according to claim 13, wherein
the one or some resonators are at least one of the one or more parallel resonators.

15. The multiplexer according to claim 14, wherein
the one or some resonators include a resonator with a lowest resonant frequency among the one or more parallel resonators.

16. The multiplexer according to claim 15, wherein
the one or more remaining resonators include a resonator with a highest resonant frequency among the one or more parallel resonators.

17. The multiplexer according to claim 14, wherein the at least one of the one or more parallel resonators is the one or more remaining resonators.

18. The multiplexer according to claim 13, wherein the one or some resonators are the one or more parallel resonators, and the one or more remaining resonators are the one or more series resonators.

* * * * *